(12) United States Patent
Liu et al.

(10) Patent No.: US 6,385,396 B1
(45) Date of Patent: May 7, 2002

(54) REFLECTOR STRUCTURE FOR IMPROVING IRRADIATION UNIFORMITY OF LINEAR LAMP ARRAY

(75) Inventors: Chee-Wee Liu; Min-Hung Lee, both of Taipei (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/426,963

(22) Filed: Oct. 26, 1999

(30) Foreign Application Priority Data

May 12, 1999 (TW) .......................................... 88207595

(51) Int. Cl.$^7$ ............................................ H01L 21/205
(52) U.S. Cl. ...................... 392/423; 392/416; 219/405; 362/297; 362/346; 250/504 R; 250/495.1
(58) Field of Search ................................. 392/423, 422, 392/424, 411, 416, 418; 219/405, 411, 390; 362/241, 297, 301, 346, 341, 360; 250/504 R, 495.1

(56) References Cited

U.S. PATENT DOCUMENTS

| | | | | |
|---|---|---|---|---|
| 4,755,654 A | * | 7/1988 | Crowley et al. | 219/405 |
| 4,789,771 A | * | 12/1988 | Robinson et al. | 219/405 |
| 4,836,138 A | * | 6/1989 | Robinson et al. | 118/666 |
| 6,122,440 A | * | 9/2000 | Campbell | 392/420 |

FOREIGN PATENT DOCUMENTS

| | | | | |
|---|---|---|---|---|
| GB | 563095 | * | 7/1944 | 392/423 |
| JP | 64-7519 | * | 1/1989 | |

* cited by examiner

*Primary Examiner*—John A. Jeffery
(74) *Attorney, Agent, or Firm*—Knobbe, Martens, Olson & Bear, LLP

(57) ABSTRACT

A reflector structure is provided for improving irradiation uniformity of a linear lamp array applied in a semiconductor process. The reflector structure includes a central reflector, two side reflectors, and two inclined reflectors. The central reflector is horizontally set above the linear lamp array at a first predetermined distance from a wafer for reflecting light irradiated from a central part of the linear lamp array to the wafer. The two side reflectors are horizontally set above the linear lamp at a second predetermined distance to the wafer, wherein the second predetermined distance is less than the first predetermined distance, and respectively connected to two opposite side parts of the central reflector for reflecting light irradiated from side parts of the linear lamp array to the wafer. The two inclined reflectors are respectively connected to one side of each of the two first side reflectors at an inclined angel to the wafer for reflecting light irradiated from two end parts of the linear lamp array to the wafer.

13 Claims, 6 Drawing Sheets

REFLECTOR STRUCTURE FOR IMPROVING IRRADIATION UNIFORMITY OF LINEAR LAMP ARRAY

FIELD OF THE INVENTION

The present invention relates to a reflector structure for improving irradiation uniformity of a linear lamp array, and especially to a reflector structure for improving irradiation uniformity of a linear lamp array applied in a semiconductor process.

BACKGROUND OF THE INVENTION

A rapid thermal process plays an important role in the semiconductor-manufacturing process. The temperature of a wafer increases very rapidly in the rapid thermal process by the infrared irradiation from a lamp array so as to grow an oxide layer, a polysilicon layer, or a source/drain region. There are many different kinds of rapid thermal processors, and each of them has a specific kind of lamp array, such as a linear lamp array, a circular lamp array, and a hexagonally honeycombed lamp array. The linear lamp array is formed by a plurality of linear lamps arranged in a direction perpendicular to its length. Since the irradiation intensity of each linear lamp is weak at its two end parts and is strong at its middle part, the irradiation uniformity of the linear lamp array is poor in the direction parallel to the linear lamps so that the temperature of the wafer can not increase evenly. However, in consideration of the production cost, the rapid thermal processor using a linear lamp array is still popularly used in some semiconductor factories.

FIG. 1 schematically shows a conventional thermal processor using a linear lamp array. The direction 4 is perpendicular to the linear lamp 2 on the plane of the linear lamp array, and the direction 5 is parallel to the linear lamp 2. Only the infrared irradiation from the front side (the side faced to the wafer 3) of the lamp array 2 can be received by the wafer 3, but the infrared irradiation from the back side (the side opposite to the wafer 3) of the lamp array 2 is wasted. Therefore, there is a planar reflector structure 1, such as a planar mirror, set on the back of the lamps for reflecting the infrared irradiation from the back side of the lamps 2 to the wafer 3.

FIG. 2 shows the irradiation intensity distribution in a conventional rapid thermal processor using a linear lamp array with the planar reflector structure along the direction 5. The length of each lamp of the linear lamp array 2 is 30 cm, the distance between the reflector structure 1 and the wafer 3 is 4 cm, and the distance between the linear lamp array and the wafer 3 is 2 cm. Since both the irradiation intensity of the infrared rays irradiated from the linear lamp array 2 and of those reflected from the reflector structure 1 are quickly weakened at its two end parts along the direction 5, the irradiation intensity of the total infrared rays received by the wafer is also quickly weakened at the two end parts. According to the theoretical estimation, a region, whose light intensity difference is less than 4%, has a temperature difference less than 1%, and is defined as an irradiation uniformity region. Therefore, the irradiation uniformity region of the conventional reflector structure is only 14 cm long under the middle part of the linear lamp array 2 along the direction 5. That is to say, if the diameter of the wafer increases, the length of the linear lamp and the size of the rapid thermal processor should greatly increase.

The conventional reflector structure also has been used in another rapid thermal processor having two sets of linear lamp arrays on the two sides of the wafer, arranged in two directions perpendicular to each other, so called "cross lamp configuration". Although the irradiation uniformity is improved by using two sets of linear lamp arrays, the production cost and the size of the rapid thermal processor significantly increases.

SUMMARY OF THE INVENTION

It is specifically an object of the present invention to provide a novel reflector structure, which can improve the irradiation uniformity of a linear lamp array applied in a semiconductor process.

It is therefore an object of the present invention to provide a novel reflector structure such that the aforementioned limitations and difficulties encountered in the prior art can be overcome.

It is specifically another object of the present invention to provide a novel reflector structure such that the production cost can be significantly reduced.

It is specifically another yet object of the present invention to provide a novel reflector structure such that the size of a rapid thermal processor can be significantly reduced.

The reflector structure of the present invention includes a central reflector, two first side reflectors. The central reflector is horizontally set above the linear lamp array at a first predetermined distance from the wafer for reflecting light irradiated from a central part of the linear lamp array to a wafer. The two first side reflectors are horizontally set above the linear lamp array at a second predetermined distance from the wafer, wherein the second predetermined distance is less than the first predetermined distance, and respectively connected to two opposite sides of the central reflector for reflecting light irradiated from two side parts of the linear lamp array to a wafer. Note that the distance variation between the reflector and wafer is parallel to the linear lamps.

Preferably, the two first side reflectors are integrally formed to the two opposite sides of the central reflector, respectively.

According to the present invention, the reflector structure further includes two inclined reflectors respectively connected to one side of each of the two first side reflectors at an inclined angle to the wafer for reflecting light irradiated from two end parts of the linear lamp array.

Preferably, the two inclined reflectors are integrally formed to the one side of each of the two first side reflectors, respectively.

Preferably, the inclined angle is equal to 45° or 30°.

According to the present invention, the reflector structure further includes two second side reflectors horizontally set above the linear lamp at a third predetermined distance to the wafer, wherein said third predetermined distance is less than the second predetermined distance, and respectively connected to one side of each of the two first side reflectors for reflecting light irradiated from two further side parts of the linear lamp array to a wafer.

The present invention may best be understood through the following description with reference to the accompanying drawings.

DETAILED DESCRIPTION OF THE PREFERRED EMBODIMENTS

Figure 1:
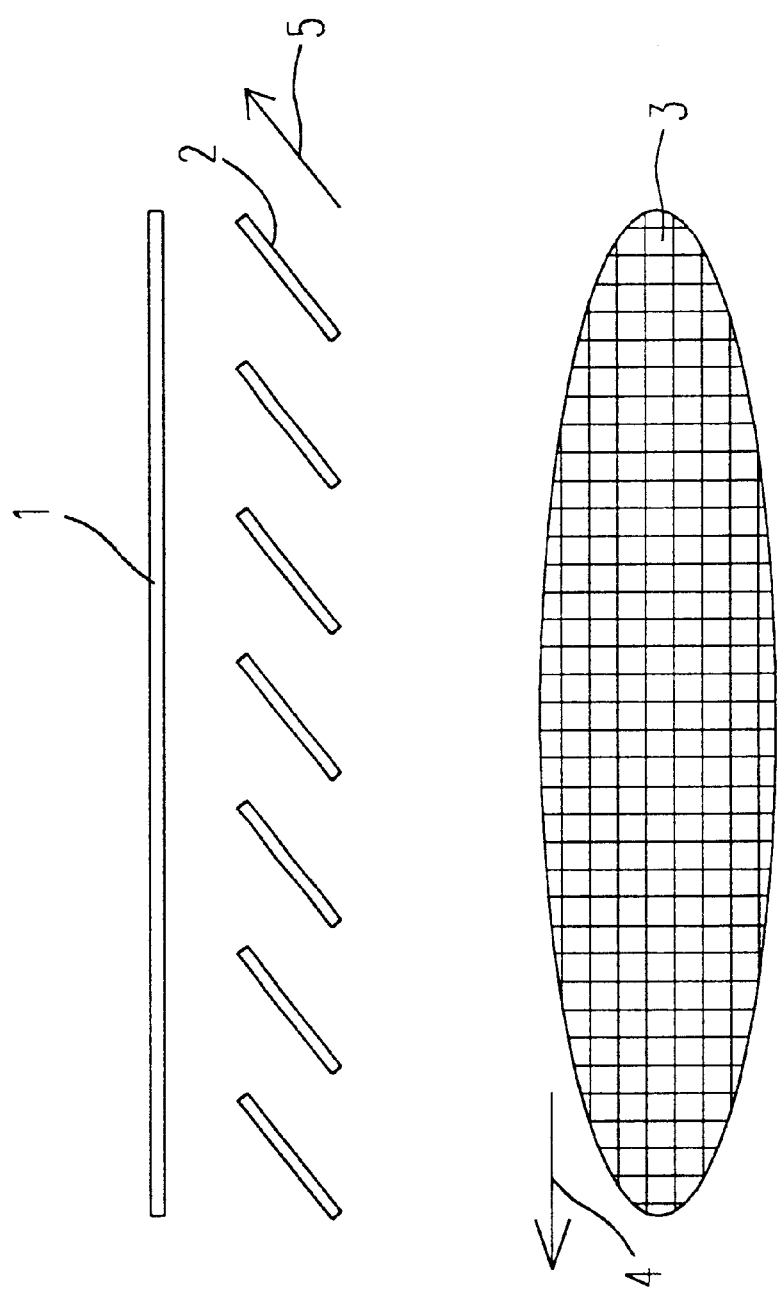
FIG. 1 schematically shows a conventional rapid thermal processor using a linear lamp array with a conventional reflector structure.
Figure 2:
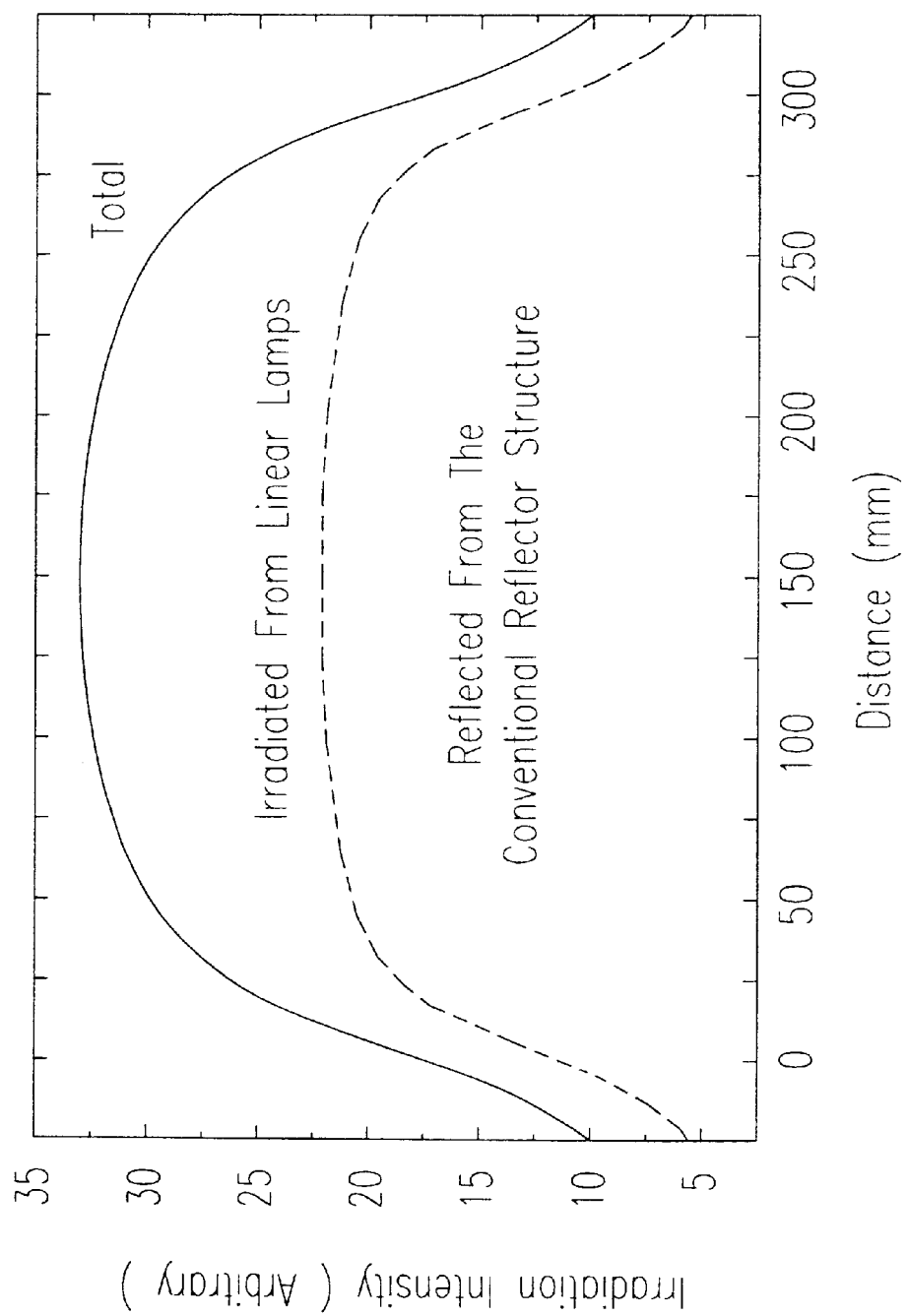
FIG. 2 shows the irradiation intensity distribution in the conventional rapid thermal processor having a linear lamp array with a conventional reflector structure.

The reflector structure of the present invention is specially designed for a rapid thermal processor having a linear lamp array 2 formed by a plurality of linear lamps arranged in one direction vertical to the length of a linear lamp, as shown in FIG.1. The reflector structure(FIG. 3) of the present invention basically includes a central reflector 6, two first side reflectors 7, and two inclined reflectors 8. The central reflector 6 is horizontally set above linear lamp array 2 at a first predetermined distance L1 from a wafer 3 for reflecting light, especially infrared rays, irradiated from the central part of the linear lamp to a wafer. The two first side reflectors 7 are horizontally set above the linear lamp array 2 at a second predetermined distance L2 from the wafer 3, wherein the second predetermined distance L2 is less than the first predetermined distance L1. The two first side reflectors 7 are respectively connected (or preferably integrally formed) to two opposite sides of the central reflector 6 for reflecting light, especially infrared rays, irradiated from two side parts of the linear lamps to a wafer. The two inclined reflectors 8 are respectively connected (or integrally formed) to one side of each of the two first side reflectors 7 at an inclined angle to the wafer 3 for reflecting light, especially infrared rays, irradiated from two end parts of the liner lamps. The inclined angle of the two inclined reflectors 8 is preferably 45° or 30°.

Because the first predetermined distance L1 is longer than the second predetermined distance L2, the irradiation intensity of the infrared rays reflected from the two first side reflectors 7 to the wafer 3 is stronger than that of the infrared rays reflected from the central reflector 6. Therefore, the wafer 3 can receive an equal amount of infrared rays irradiated from the central part and the side parts of the linear lamps. Further, since the two inclined reflectors 8 are particularly used for reflecting infrared rays from two end parts of the linear lamps to the wafer 3, the irradiation intensity at the two end parts of the linear lamps 2 is compensated. Therefore, the length of the irradiation uniform region of the present invention is effectively elongated.

Figure 3:
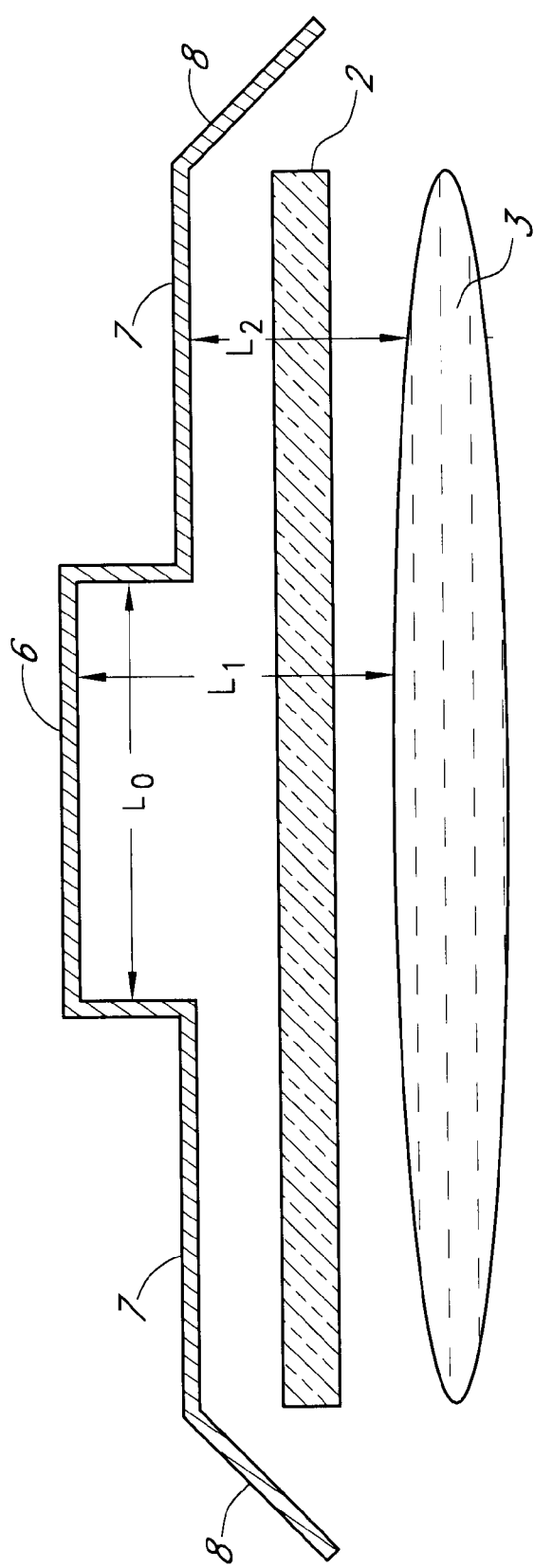
FIG. 3 schematically shows a rapid thermal processor using a linear lamp array and having a reflector structure according to the present invention.
Figure 4:
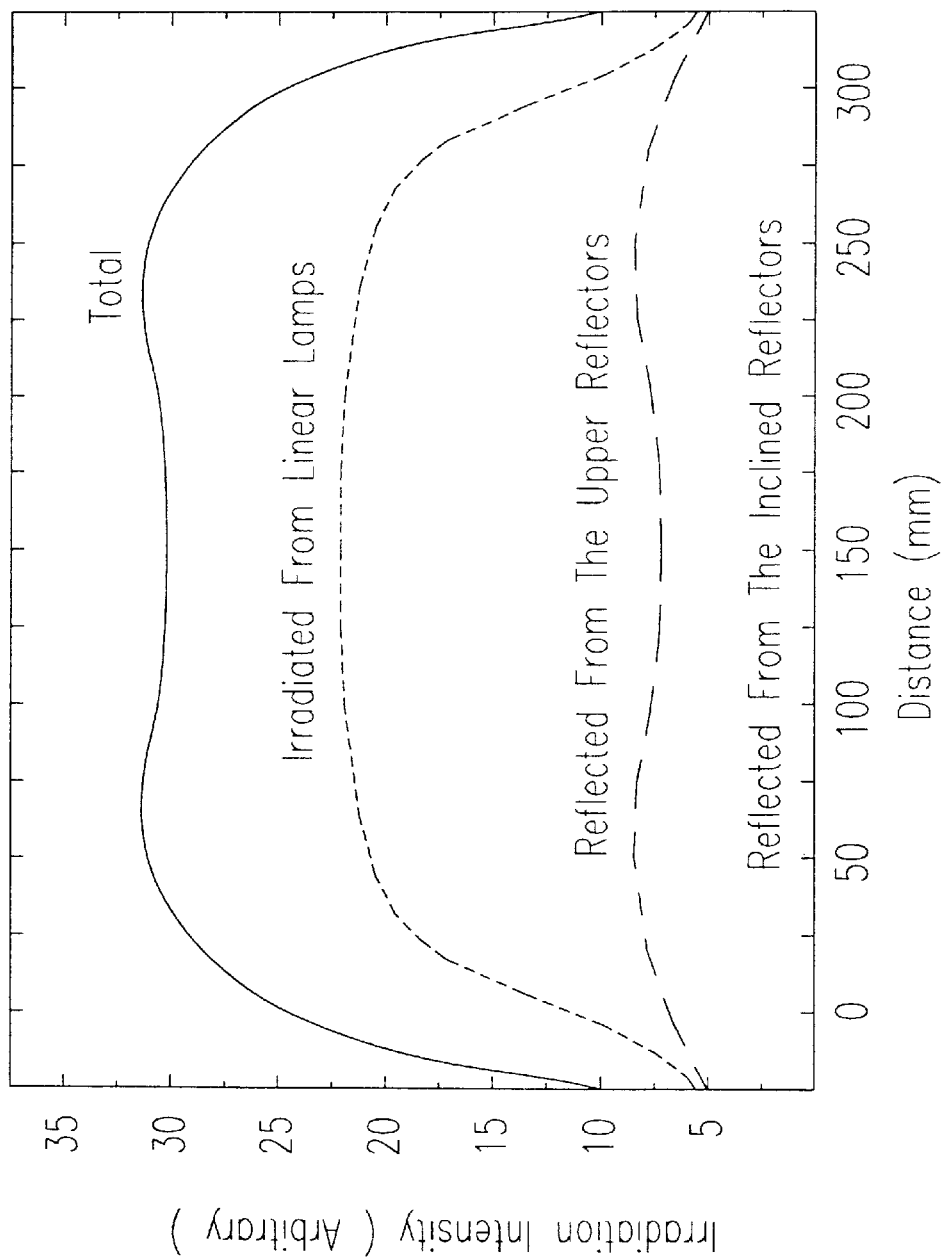
FIG. 4 shows the irradiation intensity distribution in the rapid thermal processor of FIG. 3 along the direction parallel to the linear lamps.

FIG. 4 shows the irradiation intensity distribution in the rapid thermal processor using this novel reflector structure of FIG. 3 along the direction parallel to the linear lamp. As shown in FIG. 4, the length of each of the linear lamps 2 is 30 cm, the length of the central reflector 6 is 13.5 cm, the first predetermined distance L1 (the distance between the central reflector 6 and the wafer 3) is 8 cm, the second predetermined distance L2 (the distance between the two first side reflectors 7 and the wafer 3) is 4 cm, the distance between the linear lamps 2 and the wafer 3 is 2 cm, and the two inclined reflectors 8 is at 45° and 30° angles to the wafer 3 with the length of 28 mm and 40 mm, respectively. According to the theoretical estimation, a region, whose light intensity difference less than 4%, has a temperature difference less than 1%, and defined as an irradiation uniformity region. As shown in FIG. 4, because the irradiation intensity at the two side parts and the two end parts of the linear lamps 2 is compensated by the two first side reflectors 7 and the two inclined reflectors 8, respectively, the length of the irradiation uniformity region of the conventional reflector structure increases to 25 cm.

Figure 5:
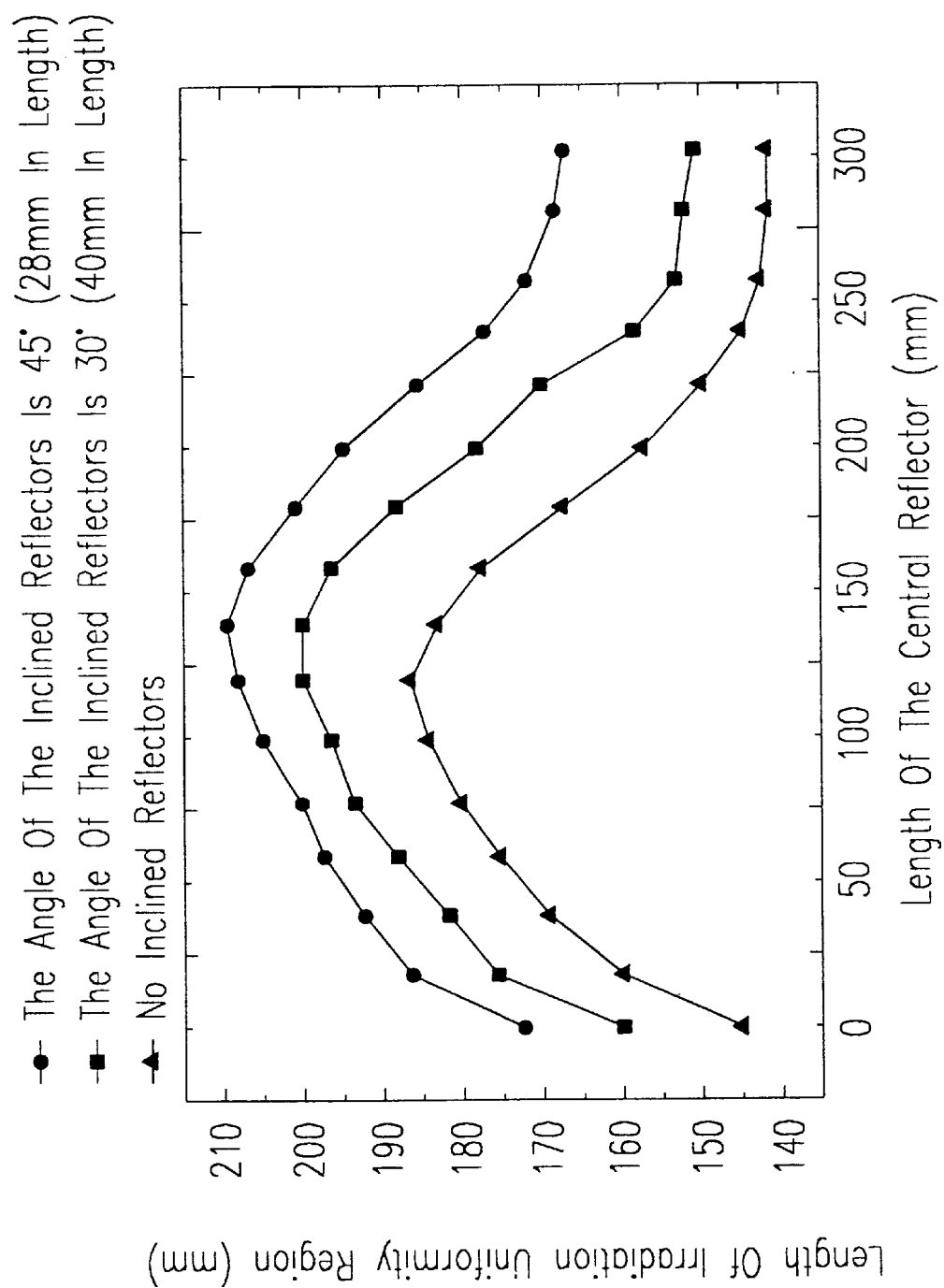
FIG. 5 is a plot of the length of the irradiation uniformity region vs. the length of the central reflector according to the present invention.

The length of the irradiation uniformity region can be controlled by the length of the central reflector L0 and the first predetermined distance L1. FIG. 5 is a plot of the length of the irradiation uniformity region vs. the length of the central reflector, and FIG. 6 is a plot of the length of the irradiation uniformity region vs. the first predetermined distance L1 according to the present invention.

Please refer to FIG. 5. The length of each linear lamp 2 is 30 cm, the first predetermined distance L1 is 5 cm, the second predetermined distance L2 is 4 cm, and the distance between the linear lamps 2 and the wafer 3 is 2 cm. When the length of the central reflector 6 is 12.5~15 cm and the inclined angle of the two reflectors 8 is 45°, the length of the irradiation uniformity region is the longest.

Figure 6:
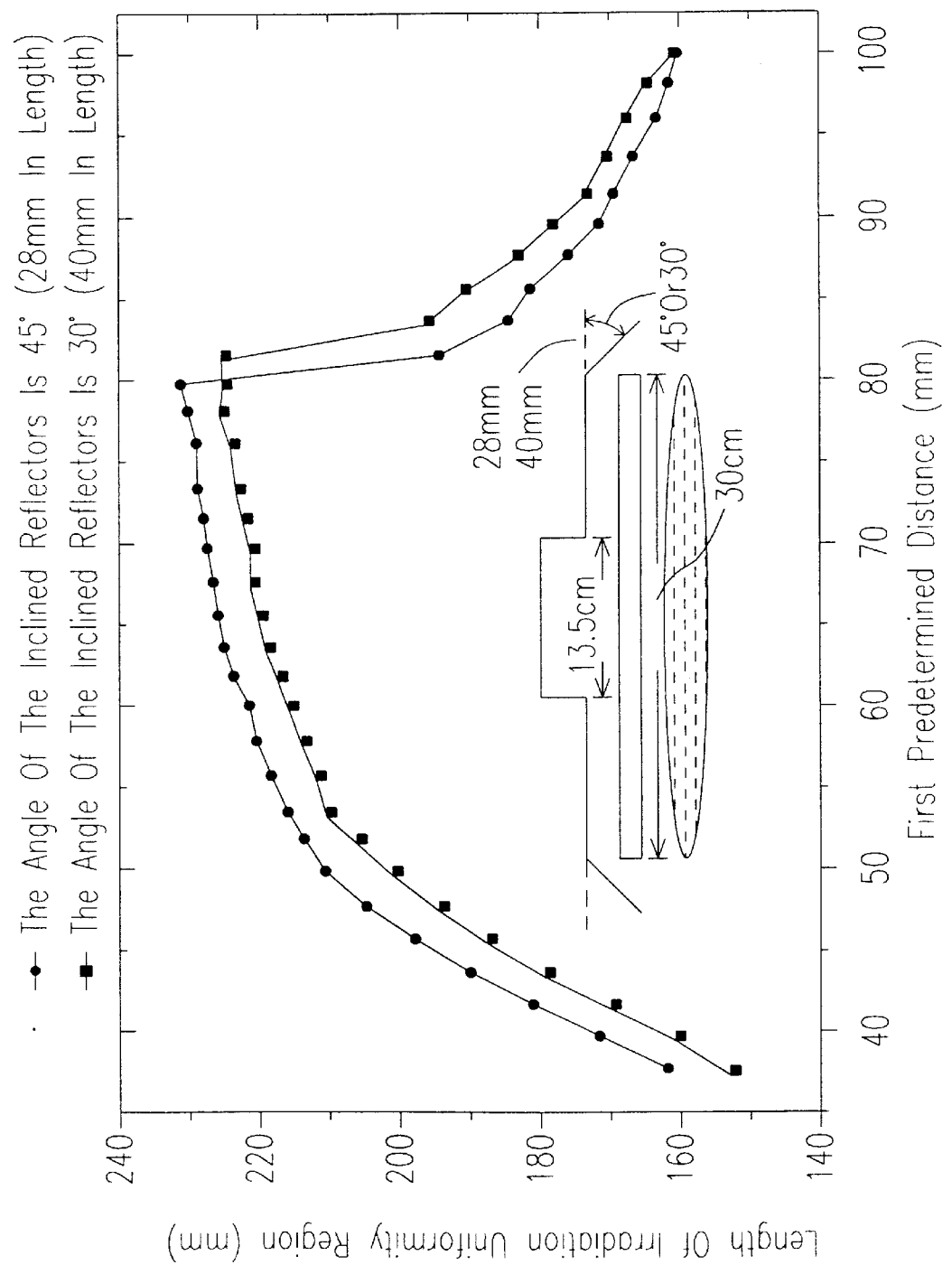
FIG. 6 is a plot of the length of the irradiation uniformity region vs. the first predetermined distance L1 according to the present invention.

Please refer to FIG. 6. The length of each linear lamp 2 is 30 cm, the length of the central reflector 6 is 13.5 cm, the second predetermined distance L2 is 4 cm, and the distance between the linear lamps 2 and the wafer 3 is 2 cm. When the first predetermined distance L1 is 8 cm and the inclined angle of the two reflectors 8 is 45°, the irradiation uniformity region has the longest length.

In conclusion, if the reflector structure of the rapid thermal processor using a linear lamp array is under the optimum condition, i.e., the length of the central reflector L0 is 13.5 cm, the first predetermined distance L1 is 8 cm, the second predetermined length L2 is 4 cm, and the inclined angle of the two reflectors 8 is 45°, for the given length of the linear lamps 2 of 30 cm and the given distance between the linear lamps 2 and the wafer 3 of 2 cm, the length of the irradiation uniformity region can be increased to 23 cm which is much better than the conventional value (14 cm).

The reflector structure of the present invention can be integrally formed or connected by a plurality of planar mirrors depending on the manufacturing technology and cost. Furthermore, the reflector structure of the present invention can further include more side reflectors horizontally set above the linear lamps. For example, the reflector structure of the present invention can further include two second side reflectors horizontally set above the linear lamps at a third predetermined distance L3, wherein the third predetermined distance L3 is less than the second predetermined distance L2. The two second side reflectors are respectively connected (or integrally formed) to one side of each of the two first side reflectors for reflecting light irradiated from further side parts of the linear lamp to the wafer. Therefore, the reflector structure of the present invention can control the irradiation uniformity of the rapid thermal processor using a linear lamp array more precisely.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A reflector structure for improving irradiation uniformity of a linear lamp array applied in a semiconductor process, wherein the linear lamp array includes at least two linear lamps parallel to each other and each of the linear lamps includes a central part and two side parts respectively connected to two opposite sides of the central part, the reflector structure comprising:

a central reflector horizontally set above the linear lamp array at a first predetermined distance from a wafer for reflecting light irradiated from a central part of the linear lamp array to the wafer; and two first flat side reflectors horizontally set above the linear lamp array at a second predetermined distance from the wafer, and respectively connected to the two opposite sides of the central reflector for reflecting light irradiated from the two side parts of the linear lamp array to the wafer, wherein the central part of the linear lamp array is set underneath the central reflector, wherein the two side parts thereof are respectively set underneath the two first flat side reflector, and wherein the second predetermined distance is less than the first predetermined distance so as to differently compensate the irradiation of the central part and the side parts of the linear lamp array so as to improve irradiation uniformity of the linear lamp array.

2. The reflector structure according to claim 1, wherein said reflector structure is used in a linear lamp array of rapid thermal processor applied in said semiconductor process.

3. The reflector according to clain 1, wherein said two firsst side reflectors are respectively integrally formed to said two opposite sides of said central reflector.

4. The reflector structure according to claim 1, wherein the reflector structure further comprises two inclined flat reflectors respectively connected to one side of each of the two first side flat reflectors at an inclined angle to the wafer for reflecting light irradiated from two end parts of the linear lamp array.

5. The reflector structure according to claim 4, wherein the two inclined flat reflectors are respectively integrally formed to the one side of each of the two first side flat reflectors.

6. The reflector structure according to claim 4, wherein said inclined angle is equal to 45°.

7. The reflector structure according to claim 4, wherein said inclined angle is equal to 30°.

8. The reflector structure according to claim 1, wherein the reflector structure further comprises two second side flat reflectors horizontally set above the linear lamp array at a third predetermined distance from the wafer, wherein the third predetermined distance is less than the second predetermined distance, and wherein the two second side flat reflectors are respectively connected to one side of each of the two first flat side reflectors for reflecting light irradiated from two further side parts of the linear lamp array to the wafer.

9. The reflector structure according to claim 8, wherein the reflector structure further comprises two inclined flat reflectors respectively connected to one side of each of the two second side flat reflectors at an inclined angle to the wafer for reflecting light irradiated from two end parts of the linear lamp array.

10. The reflector structure according to claim 9, wherein said inclined angle is equal to 45°.

11. The reflector structure according to claim 9, wherein said inclined angle is equal to 30°.

12. A reflector structure for improving irradiation uniformity of a linear lamp applied in a semiconductor process, wherein the linear lamp includes a central part, two side parts respectively connected to two opposite sides of the central part and two ends parts respectively connected to one side of each of the two side parts, the reflector structure comprising:

a central reflector horizontally set above the linear lamp at a first predetermined distance from the wafer for reflecting light irradiated from the central part of the linear lamp to the wafer;

two first flat side reflectors horizontally set above the linear lamp at a second predetermined distance from the wafer, and respectively connected to two opposite side parts of the central reflector for reflecting light irradiated from the two side parts of the linear lamp the wafer; and two inclined flat reflectors respectively connected to one side of each of the two first side flat reflectors at an inclined angle to the wafer for reflecting light irradiated from the two end parts of the linear lamp to U wafer, wherein the central part of the linear lamp is set underneath the central reflector, and wherein the two side parts thereof are respectively set underneath the two first flat side reflectors, and wherein the second predetermined distance is less than the first predetermined distance so as to differently compensate the irradiation of the central part and the side parts of the linear lamp array so as to improve irradiation uniformity of the linear lamp array.

13. A method of improving irradiation uniformity of a linear lamp used in a semiconductor process, wherein the linear lamp includes a central part of a relatively large irradiation intensity and two side parts of a relatively small irradiation intensity, the method comprising steps of:

providing a central reflector horizontally set above the linear lamp at a first predetermined distance from a wafer for reflecting light irradiated from the central part of the linear lamp array to the wafer; and providing two flat side reflectors horizontally set above the linear lamp at a second predetermined distance from the wafer, and respectively connected to the two opposite sides of the central reflector for reflecting light irradiated from the two side parts of the linear lamp to the wafer, wherein the central part of the linear lamp is set underneath the central reflector, the two side parts thereof are respectively set underneath the central reflector, and the predetermined distance is less than the first predetermined distance to differently compensate the irradiation of the central part and the side parts of the linear lamp array so as to improve irradiation uniformity of the linear lamp array.

* * * * *